(12) United States Patent
Chen et al.

(10) Patent No.: US 8,944,529 B2
(45) Date of Patent: Feb. 3, 2015

(54) ELECTRONIC DEVICE ENCLOSURE

(71) Applicants: Hong Fu Jin Precision Industry (WuHan) Co., Ltd., Wuhan (CN); Hon Hai Precision Industry Co., Ltd., New Taipei (TW)

(72) Inventors: Yun-Lung Chen, New Taipei (TW); Li Tong, Wuhan (CN); Hai-Tao Shan, Wuhan (CN)

(73) Assignee: ScienBiziP Consulting(Shenzhen)Co., Ltd., Guangdong (CN)

( * ) Notice: Subject to any disclaimer, the term of this patent is extended or adjusted under 35 U.S.C. 154(b) by 0 days.

(21) Appl. No.: 13/904,553

(22) Filed: May 29, 2013

(65) Prior Publication Data

US 2014/0042882 A1 Feb. 13, 2014

(30) Foreign Application Priority Data

Aug. 8, 2012 (CN) .......................... 2012 1 0280232

(51) Int. Cl.
*H05K 5/00* (2006.01)
(52) U.S. Cl.
CPC ........................................ *H05K 5/00* (2013.01)
USPC ........................... 312/223.2; 312/244; 16/413
(58) Field of Classification Search
CPC ....... G06F 1/181; G06F 1/182; H05K 7/1487; H05K 7/00; B60R 7/10
USPC ......... 312/223.2, 244; 16/413, 415, 419, 406, 16/445, 444; 361/679.59
See application file for complete search history.

(56) References Cited

U.S. PATENT DOCUMENTS

| 3,572,870 | A | * | 3/1971 | Marks et al. | 312/244 |
|---|---|---|---|---|---|
| 5,845,978 | A | * | 12/1998 | Jung | 312/244 |
| 6,373,692 | B1 | * | 4/2002 | Cheng | 361/679.59 |
| 6,397,435 | B1 | * | 6/2002 | Gosselet | 16/438 |
| 8,307,515 | B2 | * | 11/2012 | Ramsauer | 16/415 |
| 8,570,738 | B2 | * | 10/2013 | Fan et al. | 361/679.59 |
| 2006/0197417 | A1 | * | 9/2006 | Chen et al. | 312/223.2 |
| 2007/0210684 | A1 | * | 9/2007 | Lin et al. | 312/223.2 |
| 2011/0140584 | A1 | * | 6/2011 | Zhou | 312/223.2 |
| 2012/0026685 | A1 | * | 2/2012 | Chen et al. | 361/679.59 |
| 2012/0170215 | A1 | * | 7/2012 | Fan et al. | 361/679.59 |
| 2013/0162130 | A1 | * | 6/2013 | Liu | 312/244 |
| 2014/0028164 | A1 | * | 1/2014 | Chen et al. | 312/223.2 |

* cited by examiner

*Primary Examiner* — Daniel Rohrhoff
(74) *Attorney, Agent, or Firm* — Novak Druce Connolly Bove + Quigg LLP

(57) ABSTRACT

An electronic device enclosure includes a chassis, a mounting tray attached to the chassis, a handle rotatably attached to the mounting tray, and a resilient member. The handle includes a securing post. The resilient member includes a first portion, a second portion, and a curling portion connected to the first portion and the second portion. The curling portion is engaged with the securing post. The first portion is engaged with the handle, and the second portion extends out of the handle and abuts the mounting tray. The handle is rotated away from the mounting tray to deform the resilient member, and the resilient member is released to rotate the handle towards the mounting tray.

14 Claims, 6 Drawing Sheets

ELECTRONIC DEVICE ENCLOSURE

BACKGROUND

1. Technical Field

The present disclosure relates to an electronic device enclosure.

2. Description of Related Art

Traditional electronic device enclosures are usually inconvenient to grasp when needing to be transported. There is room for improvement within the art.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

Figure 1:
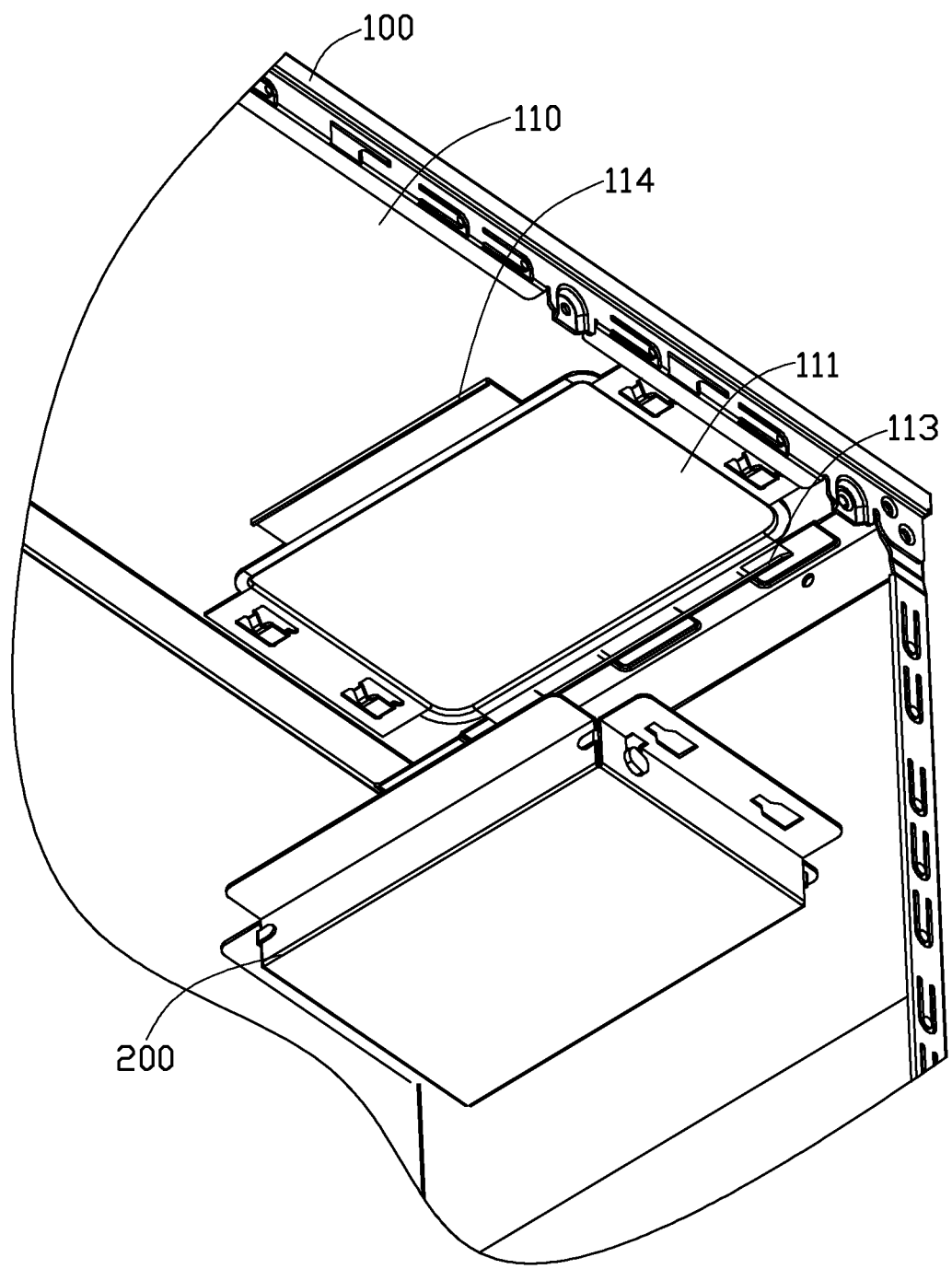
FIG. 1 is an exploded, cutaway view of an electronic device enclosure in accordance with an embodiment.
Figure 2:
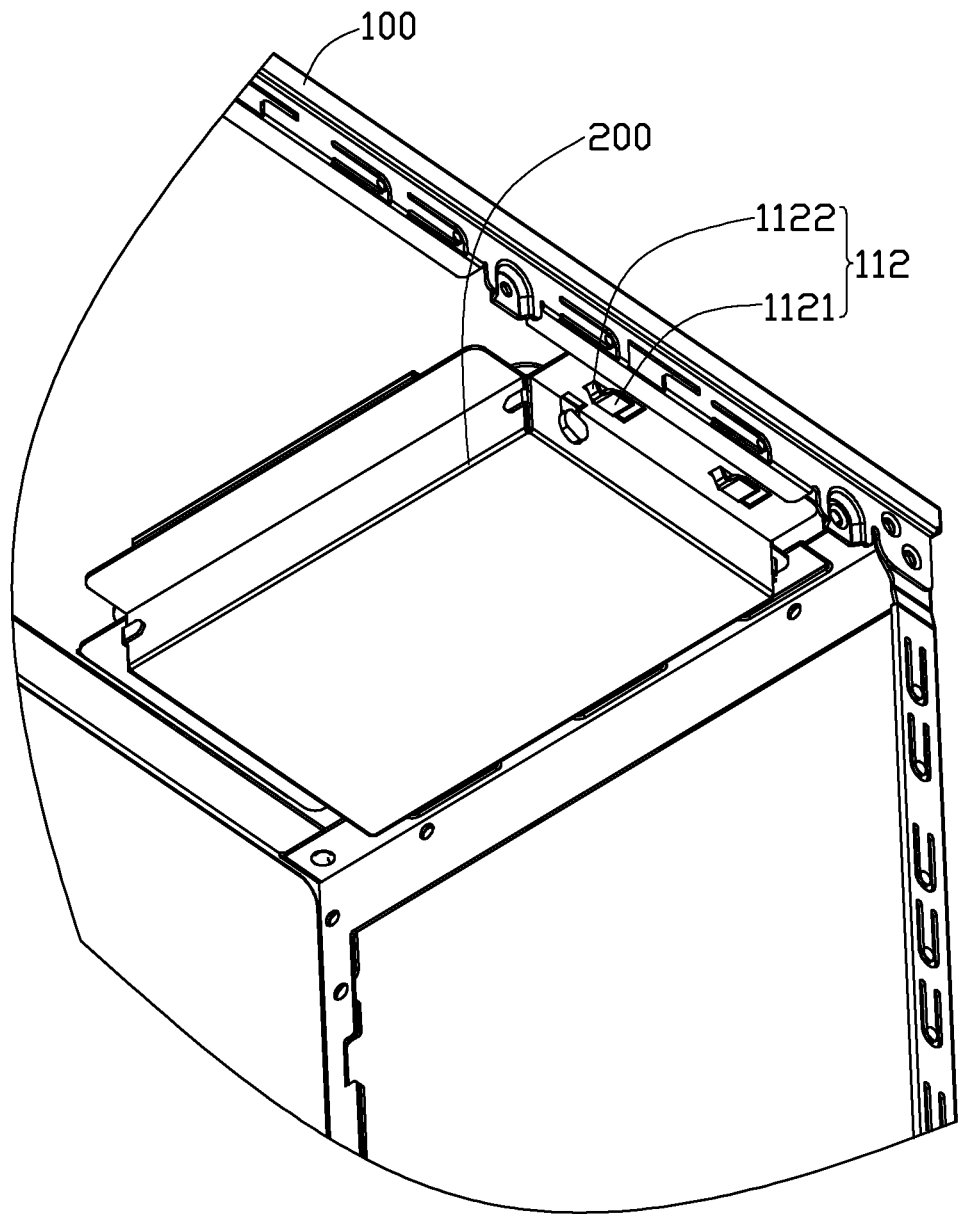
FIG. 2 is an assembled view of the electronic device enclosure of FIG. 2.
Figure 3:
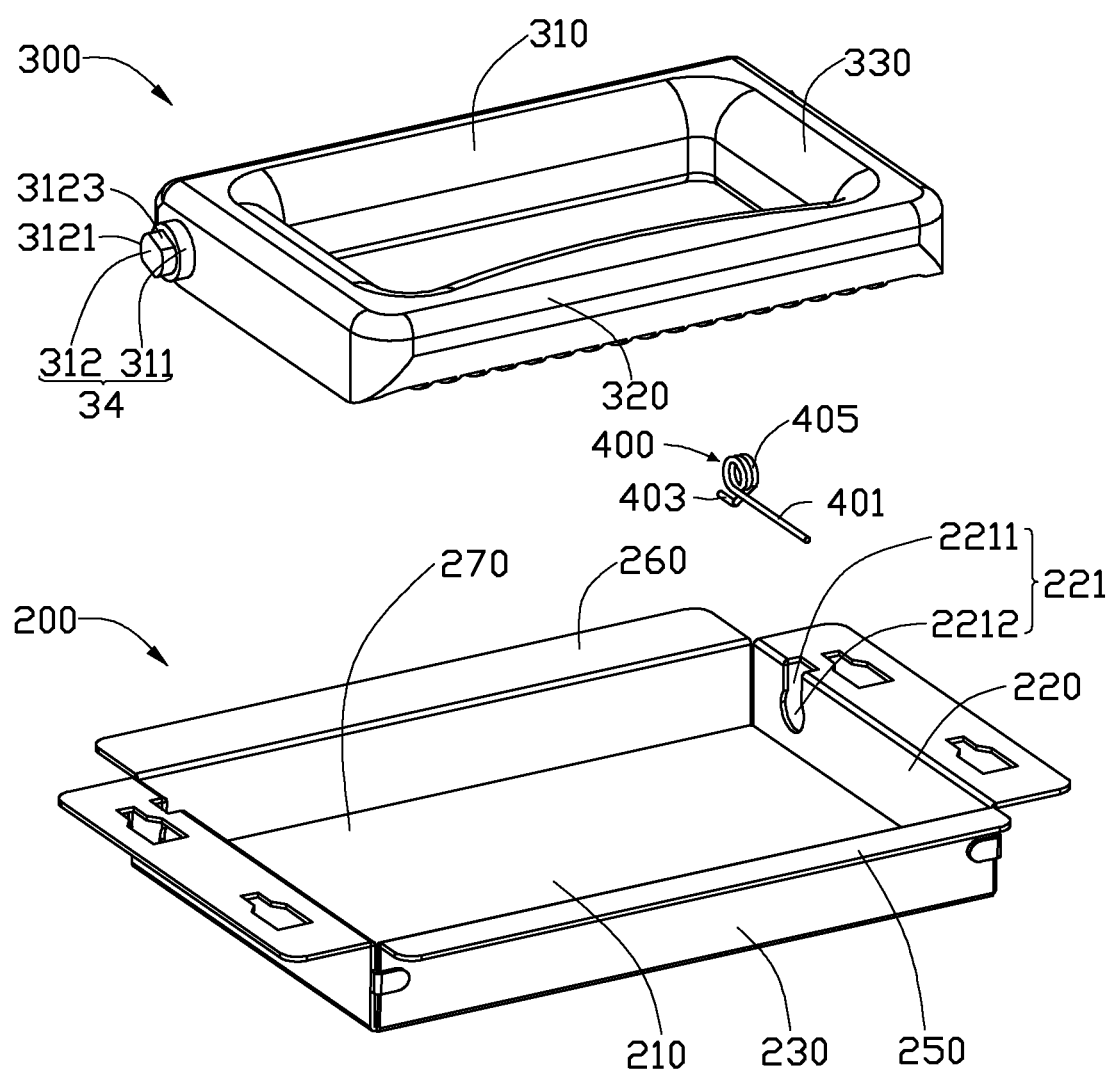
FIG. 3 is an exploded, isometric view of a mounting tray and a handle of the electronic device enclosure of FIG. 1.
Figure 4:
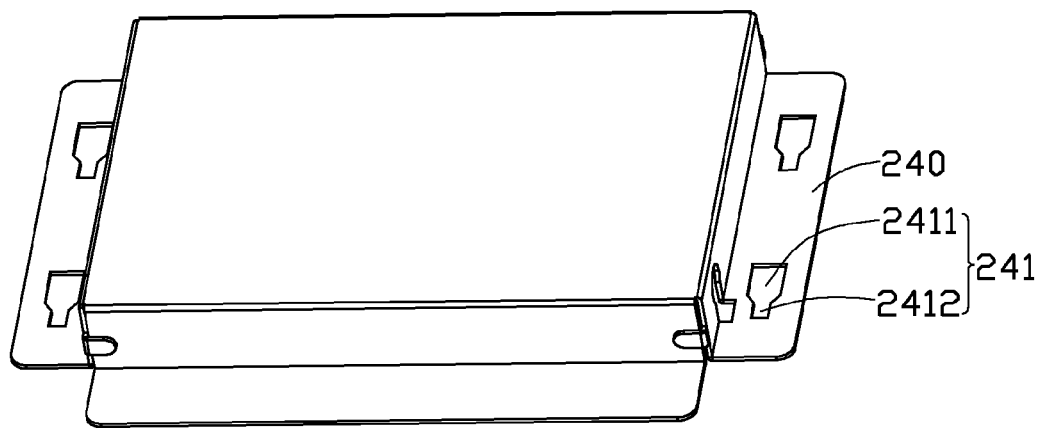
FIG. 4 is similar to FIG. 3, but viewed a different aspect.
Figure 4:
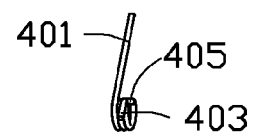
Figure 4:
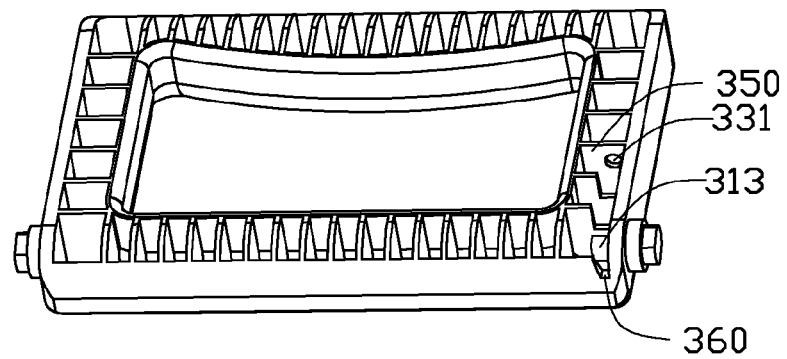

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

FIGS. 1-4, illustrate an electronic device enclosure in accordance with an embodiment. The electronic device enclosure comprises a chassis 100, a mounting tray 200 secured to the chassis 100, a handle 300 rotatably attached to the mounting tray 200, and a resilient member 400 secured to the handle 300.

The chassis 100 comprises a top plate 110. The top plate 110 defines an opening 111. The top plate 110 comprises a top surface and a bottom surface opposite to the top surface. Two pairs of clipping members 112, are arranged at opposite sides of the opening 111 and extend from the bottom surface of the top plate 110. Each of the two pairs of clipping members 112 comprises a resisting portion 1122 connected to the top plate 110 and a supporting portion 1121 connected to the resisting portion 1122. In one embodiment, an acute angle is defined between the resisting portion 1122 and the top plate 110, and the supporting portion 1121 is substantially parallel to the top plate 110. A width of the resisting portion 1122 is substantially less than a width of the supporting portion 1121. A first flange 113 and a second flange 114 extend from opposite edges of the opening 111 and towards the bottom surface of the top plate 110.

The mounting tray 200 comprises a bottom panel 210, two first side panels 220 extending from two opposite sides of the bottom panel 210, and two second side panels 230 extending from other two opposite sides of the bottom panel 210. The two first side panels 220 and the two second side panels 230 cooperatively define a receiving space 270. A mounting groove 221 is defined in each of the two first side panels 220. The mounting groove 221 comprises a guiding portion 2211 and a receiving portion 2212 communicating with the guiding portion 2211. In one embodiment, the guiding portion 2211 is substantially rectangular, the receiving portion 2212 is substantially a semi-circle, and a width of the guiding portion 2211 is less than a radius of the receiving portion 2212. A mounting arm 240 extends from each of the two first side panels 220. In one embodiment, the mounting arm 240 is substantially perpendicular to the first side panel 220 and parallel to the bottom panel 210. Two mounting holes 240 are defined in the mounting arm 240. Each of the two mounting holes 240 comprises a first mounting portion 2411 and a second mounting portion 2412 communicating with the first mounting portion 2411. In one embodiment, the first mounting portion 2411 is substantially rectangular, the second mounting portion 2412 is also substantially a rectangular, and a width of the first mounting portion 2411 is greater than a width of the second mounting portion 2412. A first securing flange 250 extends from a first one of the two second side panels 230, and a second securing flange 260 extends from a second one of the two second side panels 230. In one embodiment, the first securing flange 250 and the second securing flange 260 are substantially parallel to the bottom panel 210.

The handle 300 comprises a rotating portion 310, an operating portion 320 parallel to the rotating portion 310, and two connecting portions 330 connected to the rotating portion 310 and the operating portion 320. Two securing portions 340 extend from opposite sides of the rotating portion 310. Each of the two securing portions 340 comprises a connecting post 311 and a securing post 312 connected to the connecting post 311. In one embodiment, the connecting post 311 is substantially a cylinder. A cross-section of the securing post 312 is substantially a rectangular, and comprises opposite short ends 3121 and opposite long ends 3123. A length of the long end 3123 is less than a radius of the connecting post 311, and greater than a length of the short end 3121 and a radius of the receiving portion 2212. The length of short end 3121 is substantially equal to a width of the guiding portion 2211.

A plurality of strengthening ribs 350 are located on the handle 300 and arranged at the rotating portion 310, the operating portion 320 and two connecting portions 330. A securing hole 331 is defined in one of the plurality of strengthening ribs 350 and adjacent to the connecting portion 330. A clipping post 313 extends from an inner surface of the connecting portion 330. In one embodiment, the clipping post 313 and the securing portion 340 are arranged in a straight line that is substantially perpendicular to the connecting portion 330. A cutout 360 is defined in a corner of the rotating portion 310 and adjacent to the clipping post 313.

The resilient member 400 comprises a first portion 401, a second portion 403, and a curling portion 405 connected to the first portion 401 and the second portion 403. In one embodiment, the resilient member 400 is a torsion spring, and a length of the first portion 401 is greater than a length of the second portion 403.

Figure 5:
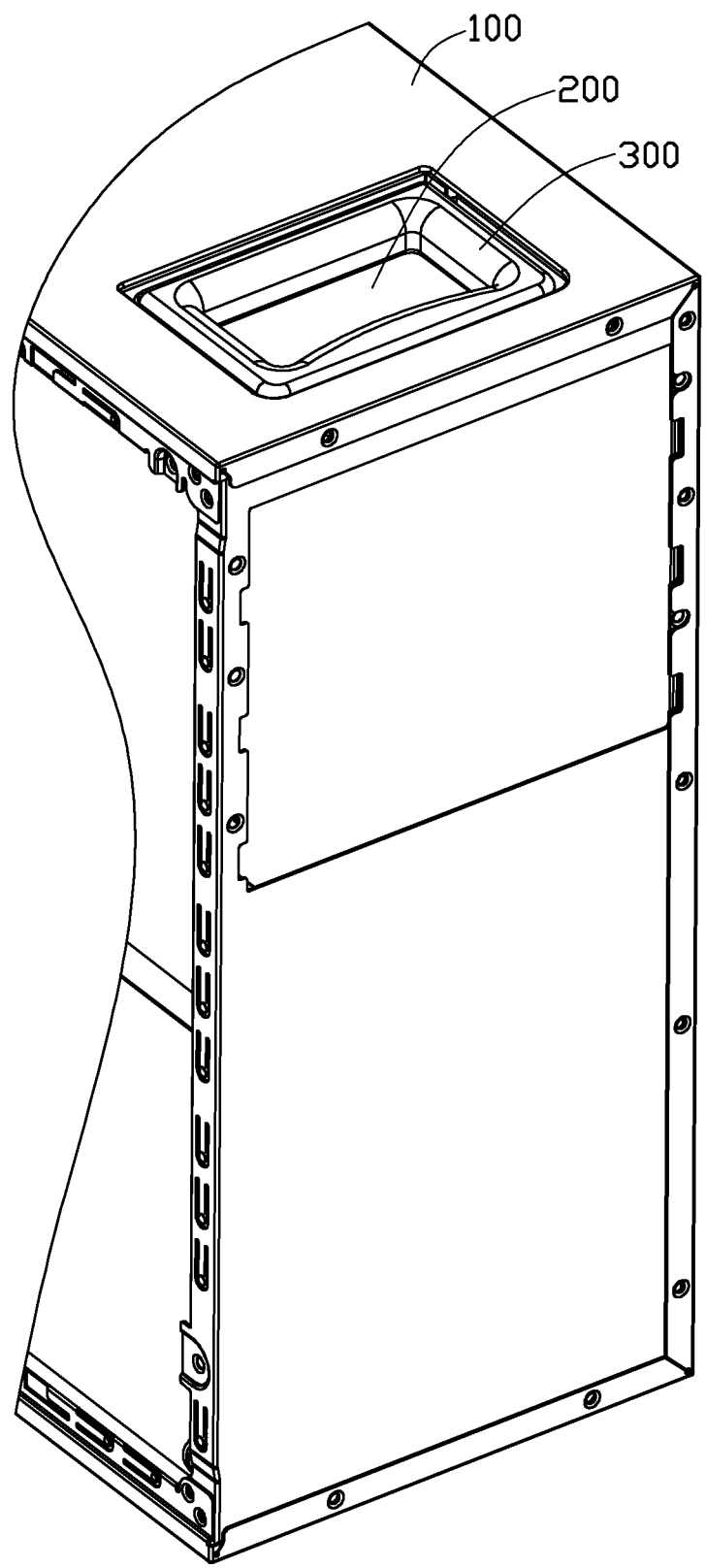
FIG. 5 is similar to FIG. 2, but shows the handle in a locked position.
Figure 6:
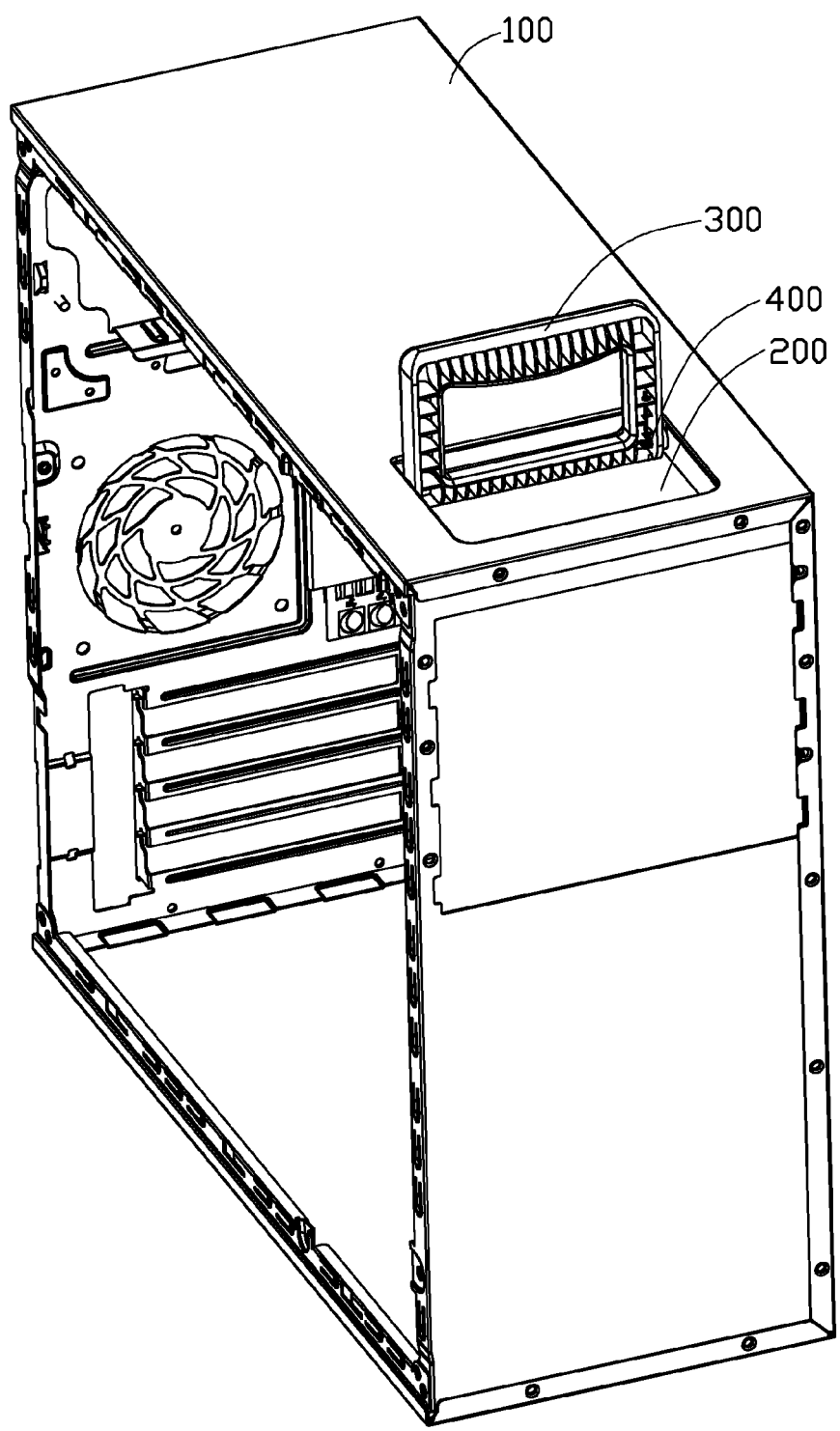
FIG. 6 is similar to FIG. 5, but shows the handle in an open position.

FIGS. 5-6 illustrates that in assembly, the curling portion 405 is secured to the clipping post 313, the first portion 401 is engaged in the securing hole 331, and the second portion 403 is engaged in the cutout 360. Thus, the resilient member 400 is secured to the handle 300. The short ends 3121 of the securing post 312 are aligned with the guiding portion 2211, and the securing post 312 is slid in the mounting groove 221. Until the securing post 312 is slid in the receiving portion 2212, the handle 300 is rotated towards the receiving space 270. The long ends 3123 of the securing post 312 is engaged in the receiving portion 2212, to prevent the securing post 312 from disengaging from the mounting groove 221. Thus, the handle 300 is rotatably attached to the mounting tray 20, and the second portion 403 extends out of the cutout 360 and abuts the bottom panel 210.

The mounting tray 200 with the handle 300 is located below the top plate 110, and the clipping members 241 are aligned with the first mounting portions 2411. The mounting tray 200 is slid in a direction substantially parallel to the top plate 110, and the clipping member 241 is slid into the second mounting portions 2412 from the first mounting portion 2411. Until the resisting portion 1122 is engaged in the second mounting portion 2412, the first securing flange 250 is clipped with the first flange 113, and the second securing flange 260 is clipped with the second flange 114. Therefore, the mounting tray 200 is secured to the top plate 110.

When the chassis 100 needs to be moved, the operating portion 320 is operated, and the handle 300 is rotated away from the mounting tray 200. The resilient member 400 is deformed. When the chassis 100 is moved to a different location, the operating portion 320 is not operated, the resilient member 400 is released to rotate the handle 300 back in the receiving space 270.

It is to be understood, however, that even though numerous characteristics and advantages have been set forth in the foregoing description of embodiments, together with details of the structures and functions of the embodiments, the disclosure is illustrative only and changes may be made in detail, especially in matters of shape, size, and arrangement of parts within the principles of the disclosure to the full extent indicated by the broad general meaning of the terms in which the appended claims are expressed.

What is claimed is:

1. An electronic device enclosure comprising:
a chassis comprising a top plate; a clipping member located on the top plate and comprising a resisting portion connected to the top plate, and a supporting portion connected to the resisting portion; an acute angle defined between the resisting portion and the top plate, and the supporting portion being substantially parallel to the top plate;
a mounting tray attached to the top plate of the chassis, and a receiving space defined in the mounting tray, the mounting tray located under the top plate;
a handle rotatably attached to and received in the mounting tray in an original state; the handle comprising a securing post engaged with the mounting tray; and
wherein the handle is rotated away from the mounting tray from the original state to an operating state where the handle is accessible from top of the top plate;
a resilient member comprises a first portion, a second portion, and a curling portion connected to the first portion and the second portion; the curling portion is engaged with the securing post, the first portion is engaged with the handle, and the second portion extends out of the handle and abutting the mounting tray;
the handle further comprises a connecting portion, the connecting portion defines a securing hole and a cutout, the first portion is engaged in the securing hole, and the second portion extends through the cutout to abut the mounting tray; and
a securing portion extends from an outer surface of the connecting portion, a mounting groove is defined in the mounting tray, and the securing post is rotatably received in the mounting groove.

2. The electronic device enclosure of claim 1, wherein a clipping post extends from an inner surface of the connecting portion, the clipping post and the securing portion are arranged in a straight line that is substantially perpendicular to the connecting portion.

3. The electronic device enclosure of claim 1, wherein the securing portion comprises a securing post, a cross-section of the securing post is substantially rectangular and comprises a short end and a long end, the mounting groove comprise a guiding portion and a receiving portion, a length of the long end is greater than a radius of the receiving portion and the length of the short end, and the length of short end is substantially equal to a width of the guiding portion.

4. The electronic device enclosure of claim 3, wherein the long end is substantially perpendicular to the short end.

5. The electronic device enclosure of claim 3, wherein the securing portion further comprises a connecting post connected to the connecting portion and the securing post, the connecting post is substantially a column, and a radius of the connecting post is greater than the length of the long end of the securing post.

6. An electronic device enclosure comprising:
a chassis;
a mounting tray attached to the chassis; the mounting tray defining a receiving space;
a handle rotatably attached to and received in the mounting tray in an original state; and the handle comprising a securing post engaged with the mounting tray and a connecting portion; a securing portion extending from an outer surface of the connecting portion; a mounting groove defined in the mounting tray, and the securing post rotatably received in the mounting groove; and
a resilient member comprising a first portion, a second portion, and a curling portion connected to the first portion and the second portion; the curling portion engaged with the securing post, the first portion engaged with the handle, and the second portion extending out of the handle and abutting the mounting tray;
wherein the handle is rotatable relative to the mounting tray between an open position and a locked position, in the open position, an angle is defined between the handle and the top plate, and the resilient member is deformed, in the locked position, the handle is received in the receiving space.

7. The electronic device enclosure of claim 6, wherein a clipping post extends from an inner surface of the connecting portion.

8. The electronic device enclosure of claim 7, wherein the connecting portion defines a securing hole and a cutout, the first portion is engaged in the securing hole, and the second portion extends through the cutout to abut the mounting tray.

9. The electronic device enclosure of claim 6, wherein the clipping post and the securing portion are arranged in a straight line that is substantially perpendicular to the connecting portion.

10. The electronic device enclosure of claim 6, wherein the securing portion comprises a securing post, a cross-section of the securing post is substantially rectangular and comprises a short end and a long end, the mounting groove comprise a guiding portion and a receiving portion, a length of the long end is greater than a radius of the receiving portion and the length of the short end, and the length of short end is substantially equal to a width of the guiding portion.

11. The electronic device enclosure of claim 10, wherein the long end is substantially perpendicular to the short end.

12. The electronic device enclosure of claim 10, wherein the securing portion further comprises a connecting post connected to the connecting portion and the securing post, the connecting post is substantially a column, and a radius of the connecting post is greater than the length of the long end of the securing post.

13. The electronic device enclosure of claim 6, wherein a clipping member extends from the bottom surface of the top plate, the mounting tray defines a mounting hole, and the clipping member is slidably received in the mounting hole.

14. An electronic device enclosure comprising:
- a chassis comprising a top plate; an opening defined in the top plate; a clipping member extending from the a bottom surface of the top plate, and comprising a resisting portion connected to the top plate, and a supporting portion connected to the resisting portion; an acute angle defined between the resisting portion and the top plate, and the supporting portion being substantially parallel to the top plate;
- a mounting tray attached to the bottom surface of the top plate of the chassis, and a receiving space and a mounting hole defined in the mounting tray; the clipping member being slidably received in the mounting hole; and
- a handle rotatably attached to and received in the mounting tray in an original state; the handle comprising a securing post engaged with the mounting tray; and the handle being rotated away from the mounting tray from the original state to an operating state where the handle is accessible from top of the top plate.

* * * * *